United States Patent
Fairbairn et al.

(10) Patent No.: US 6,486,444 B1
(45) Date of Patent: Nov. 26, 2002

(54) LOAD-LOCK WITH EXTERNAL STAGING AREA

(75) Inventors: Kevin Fairbairn, Los Gatos, CA (US); Howard E. Grunes, Santa Cruz, CA (US); Christopher Lane, San Jose, CA (US); Kelly A. Colborne, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/505,901

(22) Filed: Feb. 17, 2000

Related U.S. Application Data (60) Provisional application No. 60/137,324, filed on Jun. 3, 1999.

(51) Int. Cl.[7] .................................................. F27B 5/14
(52) U.S. Cl. ........................ 219/390; 219/405; 219/411; 118/724; 118/50.1; 392/416
(58) Field of Search .................................. 219/390, 405, 219/411; 392/416, 418; 118/724, 725, 50.1

(56) References Cited

U.S. PATENT DOCUMENTS

| | | | |
|---|---|---|---|
| 4,512,391 A | 4/1985 | Harra | 165/48 R |
| 5,607,009 A | * 3/1997 | Turner et al. | 165/48.1 |
| 5,609,689 A | 3/1997 | Kato et al. | 118/719 |
| 5,838,121 A | 11/1998 | Fairbairn et al. | 318/45 |
| 5,844,195 A | 12/1998 | Fairbairn et al. | 219/121.43 |
| 5,855,681 A | 1/1999 | Maydan et al. | 118/719 |
| 5,902,088 A | 5/1999 | Fairbairn et al. | 414/217 |
| 5,905,302 A | 5/1999 | Lane et al. | 257/678 |
| 5,909,994 A | 6/1999 | Blum et al. | 414/217 |
| 5,911,834 A | 6/1999 | Fairbairn et al. | 134/1.3 |
| 6,000,227 A | 12/1999 | Kroeker | 62/62 |
| 6,143,083 A | * 11/2000 | Yonemitsu et al. | 118/719 |
| 6,235,634 B1 | * 5/2001 | White et al. | 438/680 |

FOREIGN PATENT DOCUMENTS

| | | | |
|---|---|---|---|
| JP | 6-132379 | 5/1994 | H01L/21/68 |
| JP | 6-314730 | 11/1994 | H01L/21/68 |
| JP | 7-086169 | 3/1995 | H01L/21/205 |
| JP | 7-094489 | 4/1995 | H01L/21/3065 |
| JP | 7-142552 | 6/1995 | H01L/21/68 |
| JP | 7-335711 | 12/1995 | H01L/21/68 |
| JP | 9-246347 | 9/1997 | H01L/21/68 |
| JP | 10-275848 | 11/1998 | H01L/21/00 |

* cited by examiner

*Primary Examiner*—Teresa Walberg
*Assistant Examiner*—Shawntina T Fuqua
(74) *Attorney, Agent, or Firm*—Moser, Patterson & Sheridan (57) ABSTRACT

The present invention generally provides a vacuum system having a small-volume load-lock chamber for supporting a substrate set of only two rows of substrates, which provides for quick evacuation and venting of the load-lock chamber to provide a continuous feed load-lock chamber. More particularly, the present invention provides a transfer chamber; one or more processing chambers connected to the transfer chamber; a substrate handling robot disposed in the transfer chamber; and at least one load-lock chamber connected to the transfer chamber, and having one or more substrate support members for supporting one or more stacks of only two substrates per stack. Another aspect of the invention provides a staging, or storage rack associated with or integrated with the load-lock chamber. More particularly, the staging, or storage rack may be located outside the transfer chamber and accessible by a staging robot serving the load-lock chamber. The staging or storage rack may temporarily store processed substrates for cooling of the substrates prior to replacing the substrates within substrate cassettes during idle time of the staging robot. In this way, the substrates may continue to be cooled without interrupting the operation of the load-lock chamber.

38 Claims, 9 Drawing Sheets

LOAD-LOCK WITH EXTERNAL STAGING AREA

This application claims the benefit of No. 60/137,324, filed Jun. 3, 1999.

BACKGROUND OF THE INVENTION

1. Field of the Invention

The present invention relates generally to the storage and transfer of substrates typically used in the fabrication of electronic devices such as integrated circuits and flat panel displays. Specifically, the invention relates to a load-lock chamber and a pre-processing or post-processing storage rack used to transition substrates from one environment to another environment in a processing system.

2. Background of the Invention

Figure 1:
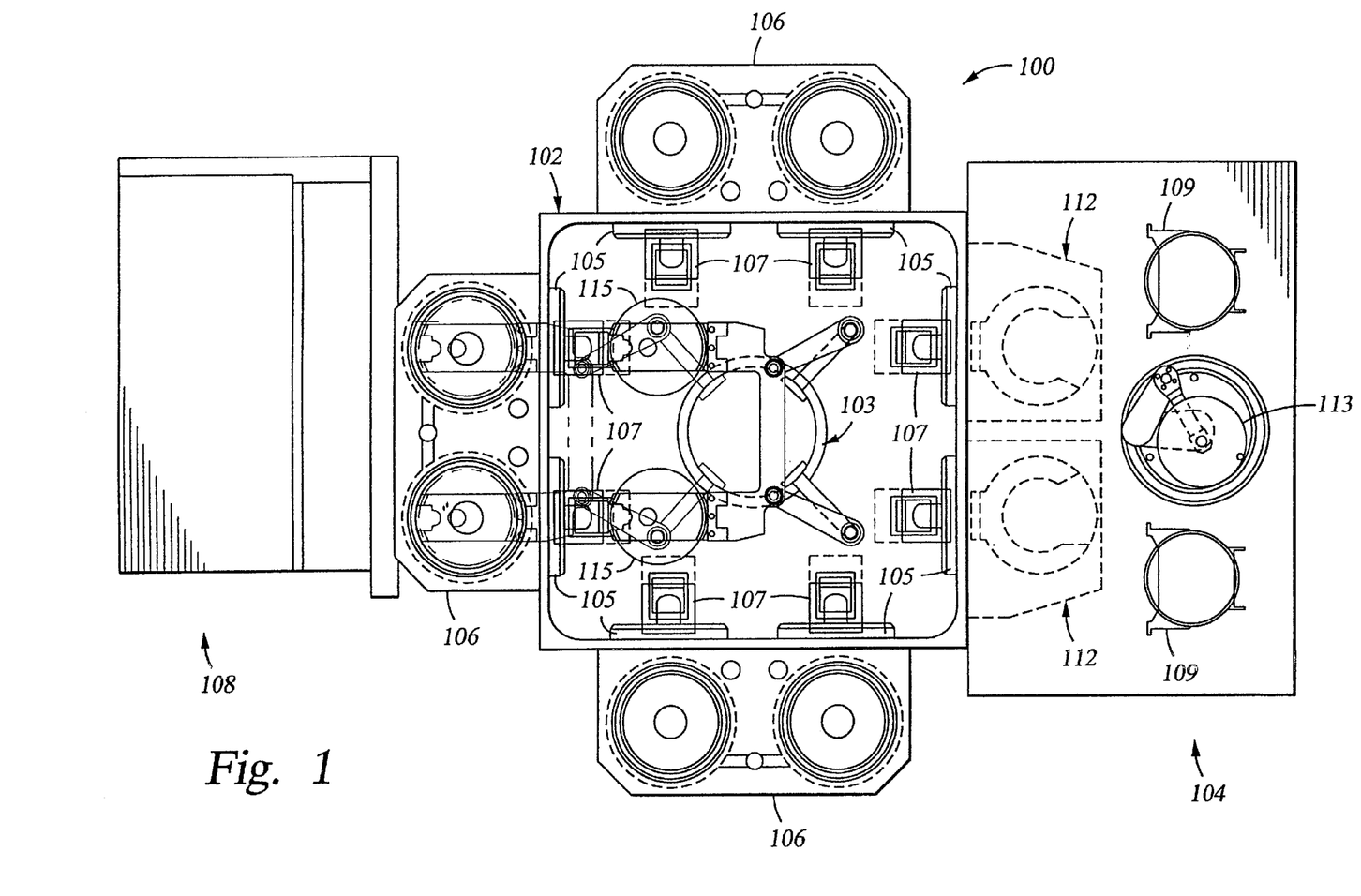
FIG. 1 is a top schematic view of a first embodiment of a vacuum system in accordance with the present invention.
Figure 2:
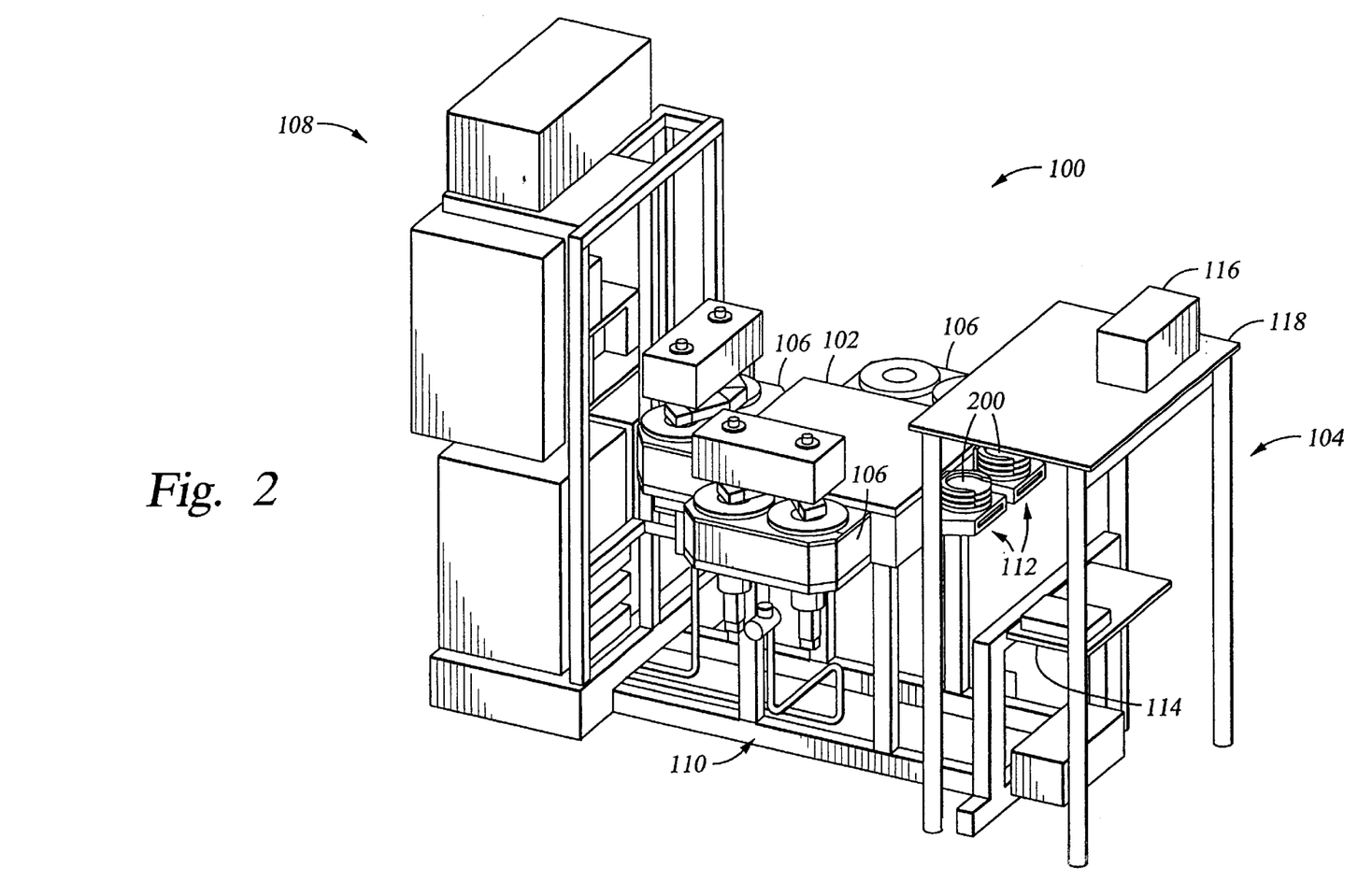
FIG. 2 is a perspective view of a vacuum system in accordance with the present invention.

Vacuum processing systems used in the fabrication of integrated circuits and flat panel displays are generally known. An example of a vacuum processing system 100 is shown in FIGS. 1 and 2. The vacuum processing system 100 typically has a centralized transfer chamber 102 mounted on a monolith platform or main frame structure 110. One or more process chambers 106 are in communication with the transfer chamber 102 via access ports 105 and associated slit valves 107. Substrates are passed through the system by a substrate handling robot 103 disposed in the transfer chamber 102. The slit valves 107 isolate the process chambers 106 from each other and from the transfer chamber 102 while substrates are being processed. The transfer chamber 102 is typically held at a constant vacuum, while the process chambers 106 may be pumped to a greater or lesser vacuum than the transfer chamber 102 for performance of their respective processes. Afterward, the process chamber pressure returns to the level in the transfer chamber 102 before opening the slit valve 107 is opened to permit access between the chambers.

The substrate handling robot 103 disposed in transfer chamber 102 typically retrieves one or more unprocessed substrates from one or more load-lock chambers 112 connected to the transfer chamber 102 and places the substrates in the process chambers 106. The load-lock chambers 112 selectively cycle between the pressure level of the ambient environment and the pressure level in the transfer chamber 102 to transition the substrates between atmospheric pressure and the vacuum environment of the transfer chamber 102. The load-lock chambers 112 typically have a large volume and store multiple substrates. Typically, twelve to twenty-four substrates are stacked vertically in one or more substrate cassettes 109 disposed in load-lock chambers 112. The substrate cassettes 109 typically include a plurality of substrate supports spaced vertically to permit a substrate handling robot blade 115 to reach under a substrate to remove or place a substrate. Substrates are typically loaded in and removed from the load-lock chamber 112 by either a staging robot 113 (shown in FIGS. 1 and 3), or an operator at or near a frontend staging area 104.

Typically, the front-end staging area 104 is maintained at or near ambient or atmospheric pressure. Accordingly, prior to transfer of substrates into or out of the loadlock chamber 112, the atmospheric volume within the load-lock chamber 112 must be vented to atmospheric pressure before opening the valves of the load-lock chamber 112. Similarly, before transfer of substrates between the load-lock chamber 112 and the transfer chamber 102, the atmospheric volume within the load-lock chamber 112 must be evacuated to the low pressure maintained in the transfer chamber 102.

Because of the sizable volume within typical load-lock chambers 112, a relatively lengthy amount of time is required to vent and then evacuate the load-lock chamber 112 before permitting access to the substrates by the substrate handling robot 103 This process may typically take approximately four (4) minutes to complete. During this time, the vacuum processing system 100 typically sits idle while awaiting the introduction of additional unprocessed substrates into the system.

It has been found that substantial production gains can be made by reducing the atmospheric volume within the load-lock chamber 112 serving the transfer chamber 102. Accordingly, systems having single substrate load-lock chambers have been developed to reduce venting and evacuation time within the load-lock process chamber 112, which has resulted in a reduction of process chamber idle time and an increase in production. One exemplary system of this type is shown in U.S. patent application Ser. No. 08/990, 396, entitled "Single Wafer Load-lock Chamber For Pre-Processing And Post-Processing Wafers In A Vacuum Processing System," filed on Feb. 15, 1997, which is incorporated herein by reference.

However, the reduction in the number of substrates housed in the load-lock chamber 112 requires that the substrates must be transferred quickly into and out of the load-lock chamber 112. This can be problematic when substrates must be pre-heated prior to processing or cooled following processing before being replaced into a substrate cassette 109. Unfortunately, a shorter transition time through the load-lock chamber 112 may prevent the load-lock chamber 112 from sufficiently pre-heating a substrate prior to processing or cooling a substrate following processing.

To accommodate this cooling and/or pre-heating process, existing systems have provided cooling and/or pre-heating chambers attached to the transfer chamber 102. Because space may be limited on a typical transfer chamber 102, such systems are required to forfeit a facet on which a processing chamber 106 could be mounted. Alternatively, systems may have limited throughput due to a limited number of preheating/cooling chambers mounted to the transfer chamber 102 and/or the amount of time required to perform the pre-processing/post processing procedures. In systems where heating and/or cooling members are integrated within the load-lock chamber 112, throughput may be limited because a cooling process may require an extended cooling time beyond the time in which the substrate handling robot 103 can return to the load-lock chamber 112 to return a processed substrate or retrieve an unprocessed substrate for further processing. As a result, the system substrate transfer system is limited by the time required for the cooling process to be performed.

Accordingly, there is a need for a vacuum processing system that provides high throughput and pre-processing and/or post-processing processes. More particularly, there is a need for an integrated system having a load-lock chamber with an integrated staging, or storage rack mounted external to the transfer chamber for pre-processing and/or post-processing of substrates.

SUMMARY OF THE INVENTION

The present invention generally provides a vacuum apparatus for processing substrates, comprising a transfer chamber; one or more processing chambers in communication with the transfer chamber; a substrate handling robot disposed in the transfer chamber; and at least one load-lock chamber connected to the transfer chamber, with the loadlock chamber having one or more substrate support members for supporting one or more substrates. The apparatus preferably includes a substrate staging area and may further include a staging robot disposed in the staging area to load substrates into and remove substrates from the load-lock chamber.

In another aspect of the invention, the staging area may include one or more storage racks associated with the load-lock chamber for receiving and temporarily storing substrates. Further, the storage racks, preferably include at least a cooling element and are adapted to temporarily receive and cool substrates retrieved from the load-lock chamber following processing.

In another aspect of the invention, at least one of the storage racks may include a heating element adapted to pre-heat unprocessed substrates retrieved from the substrate cassette prior to processing. Further, the storage racks may include a cooling element and/or a heating element, each adapted to receive and process a substrate prior to transfer. Still further, the load-lock chamber may include a heating element disposed in connection therewith for pre-heating unprocessed substrates in the load-lock chamber, and the load-lock chamber may include a substrate support member for receiving a substrate thereon.

In another aspect of the invention, the load-lock chamber may include a substrate support member for receiving a single stack of two or more substrates thereon, preferably in a single load-lock chamber connected to a single facet of the transfer chamber. Further, each load-lock chamber may include a dual substrate support member for receiving two stacks of two substrates thereon. In another aspect, a plurality of load-lock chambers may be provided, wherein each load-lock chamber is connected to a different facet of the transfer chamber.

In another aspect, the invention is directed to a method of processing substrates, comprising the steps of providing unprocessed substrates to a load-lock chamber with a staging robot, retrieving the unprocessed substrates from the load-lock chamber with a substrate handling robot located within a transfer chamber, processing the unprocessed substrates in one or more process chambers connected to the transfer chamber, returning the processed substrates to the load-lock chamber with the substrate handling robot, retrieving the processed substrates from the load-lock chamber with the staging robot, placing the processed substrates in a cooling station located external to the load-lock chamber and the transfer chamber, and cooling the substrate in the cooling station; and retrieving the cooled substrates from the cooling station with the staging robot and placing them in a substrate cassette.

In another aspect, the invention is directed to a method of processing substrates, comprising: a) providing a vacuum apparatus with a transfer chamber, one or more processing chambers connected to the transfer chamber, a substrate handling robot disposed in the transfer chamber, and a load-lock chamber connected to the transfer chamber and having at least one substrate support member for supporting a substrate thereon; b) initially loading the load-lock chamber and transfer chamber with one or more unprocessed substrates; c) processing the substrates in one or more processing chambers; d) removing the processed substrates from the one or more processing chambers with a substrate handling robot; e) placing the processed substrates within the load-lock chamber with the substrate handling robot; f) retrieving the processed substrates within the load-lock chamber with a staging robot located external to the load-lock chamber; g) placing the processed substrates within a storage rack located external to the load-lock chamber with the staging robot; and h) repeating steps c) through g), while retrieving cooled substrates from the staging or storage rack with the staging robot and placing the cooled substrates within substrate cassettes with the staging robot during staging robot idle time.

Further, each substrate set may include a single substrate in each of two substrate stacks, and the method may further include the step of pre-heating the unprocessed set of substrates within the load-lock chamber prior to removal by the substrate handling member. Further, the method may include the step of pre-heating the unprocessed set of substrates within the storage rack prior to their placement in the load-lock chamber.

In still another aspect, the invention is directed to a staging module for use with a substrate processing system, comprising: at least one load-lock chamber adapted to be connected to a transfer chamber of the substrate processing system; and one or more storage racks associated with the load-lock chamber for receiving and temporarily storing substrates. At least one of the one or more storage racks may be a cooling rack, preferably including a cooling element, adapted to cool processed substrates following processing by the substrate processing system. Further, at least one of the one or more storage racks may be a pre-heating rack, preferably including a pre-heating element, adapted to pre-heat unprocessed substrates prior to processing by the substrate processing system. Still further, the staging module may include one or more cooling racks, preferably including a cooling element and one or more heating racks, preferably including a heating element.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

The present invention generally provides a vacuum processing system 100, which processes multiple substrates with high substrate throughput and reduced system idle time and footprint. The system is preferably a vacuum system having a load-lock chamber for introducing substrates into the system and an external storage rack associated therewith to provide pre-processing and/or post-processing, such as heating or cooling, of substrates. The substrates can be any size, such as 200 mm, 300 mm, or larger. The load-lock chamber preferably includes a heating element, such as a heating lamp or a resistive heating element, to heat substrates therein prior to their introduction into a processing system.

FIG. 1 is a top schematic view of a vacuum processing system 100 according to the present invention having the necessary processing utilities supported on a main frame structure 110 (shown in FIG. 2). The processing system 100 generally includes four different regions, namely; a front end staging area 104 where substrate cassettes 109 are supported and substrates are loaded into and unloaded from a load-lock chamber 112, a transfer chamber 102 housing a substrate handling robot 103, a plurality of process chambers 106 mounted on the transfer chamber 102, and a back end 108 which houses the support utilities needed for operation of the system 100. Each load-lock chamber 112 of the front end stage area 104 is adapted to receive one or more substrates in a cassette.

A substrate handling robot, or staging robot 113, is disposed in the staging area 104. The staging robot 113 is adapted to load a substrate into and remove a substrate from the load-lock chamber 112 or substrate cassettes 109. Preferably, the staging robot 113 is positioned between the substrate cassette turntables 111 (shown in FIG. 3). The substrate handling robot 103 may have a plurality of substrate handling blades 115 for concurrently transporting a plurality of substrates between the load-lock chamber 112 and the plurality of process chambers 106. The handling blades 115 of the substrate handling robot 103 are coplanar to one another. In addition, and by way of example only, one embodiment is shown and described herein that is adapted for use with single-substrate handling robots. Another embodiment shown and described herein is adapted for use with dual-substrate handling robots. A particular embodiment may be adapted for use with either single-substrate, dual-substrate, or any other type of substrate handling robot consistent with the teachings herein. The system can be adapted to accommodate various processes such as chemical vapor deposition (CVD), physical vapor deposition (PVD) and etch processes and the related hardware to perform these processes.

FIG. 2 is a perspective view of a vacuum processing system 100 illustrating the front end staging area 104 having a staging platform 114 and a computer monitor 116 supported on a monitor shelf 118 above the support shelf 120 (shown in FIG. 3) to provide touch control to an operator. Staging racks 200 are shown mounted on the load lock chambers 112.

Figure 3:
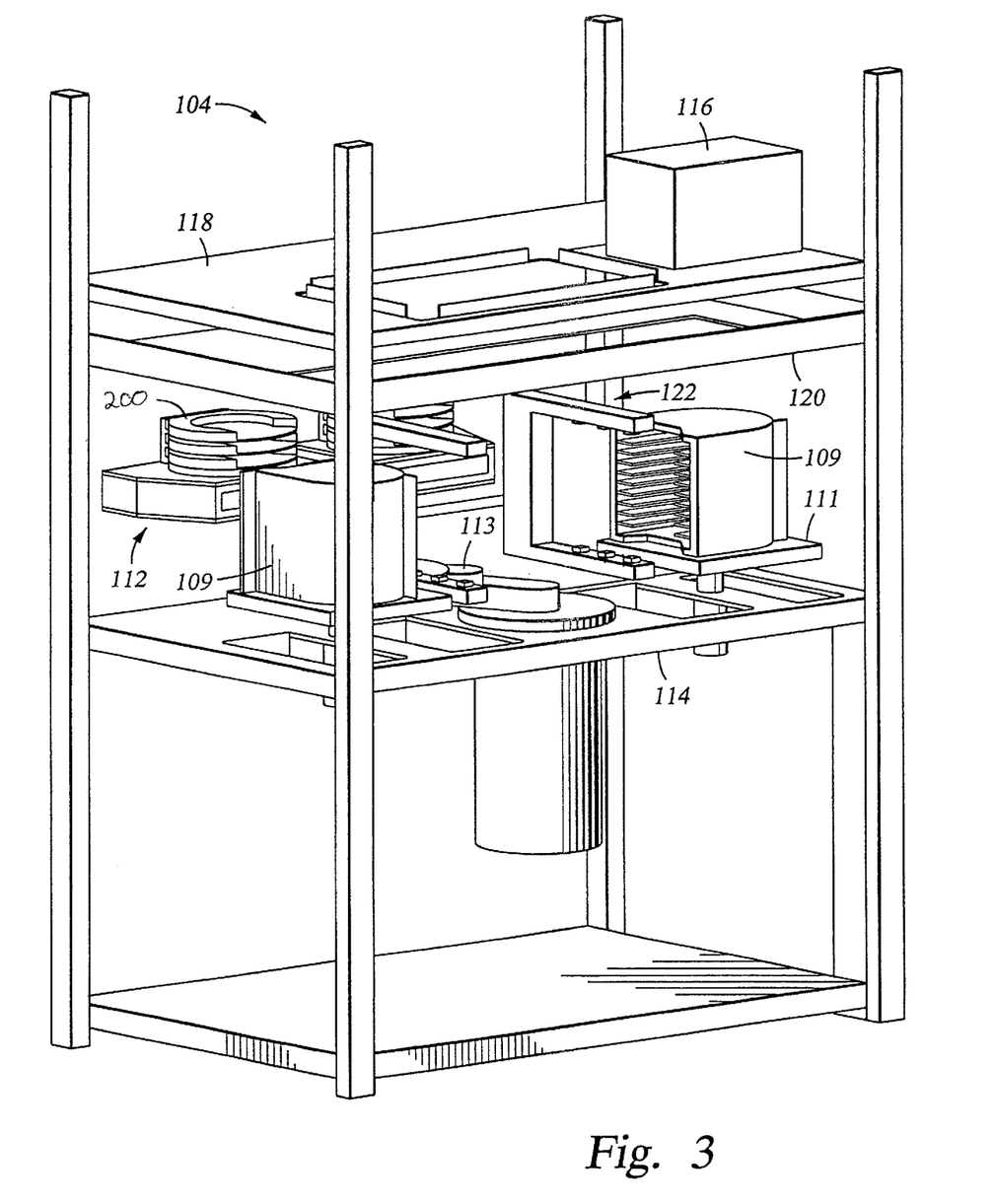
FIG. 3 is a partial perspective view of a vacuum system in accordance with the present invention, showing the staging area associated therewith.

FIG. 3 shows the front end staging area 104 of the system 100 having one or more substrate cassette turntables 111 rotationally mounted through a staging platform 114 supporting one or more substrate cassettes 109. The substrate cassettes 109 are adapted to contain a plurality of substrates mounted in a spaced vertical arrangement. A front end substrate handler, preferably a staging robot 113, is disposed on the staging platform 114 adjacent to the substrate cassette turntables 111 and a pair of load-lock chambers 112. Preferably, the staging robot 113 includes a substrate mapping system to index the substrates in each substrate cassette 109 in preparation for loading the substrates into a load-lock cassette disposed in the load-lock chamber 112. One substrate handler with a substrate mapping system used advantageously in the present system is available from Equippe Technologies, located in Sunnyvale, Calif., as Model Nos. ATM 105 or 107. The substrate mapping sensor verifies the number of substrates and orientation of the substrates in the cassette 109 before positioning the substrates in the load-lock chamber 112 for processing or in a staging rack 200 mounted on the load-lock chamber 112. Additionally, an exhaust system and filter 122, such as an ULPA filter, available from Enviroco Corporation located in Albuquerque, N. Mex.; Flanders located in San Rafael, Calif., or Filtra located in Santa Ana, Calif., is mounted to the bottom of a support shelf 120 above the platform 114 to provide particle control in the front end of the system.

Figure 4:
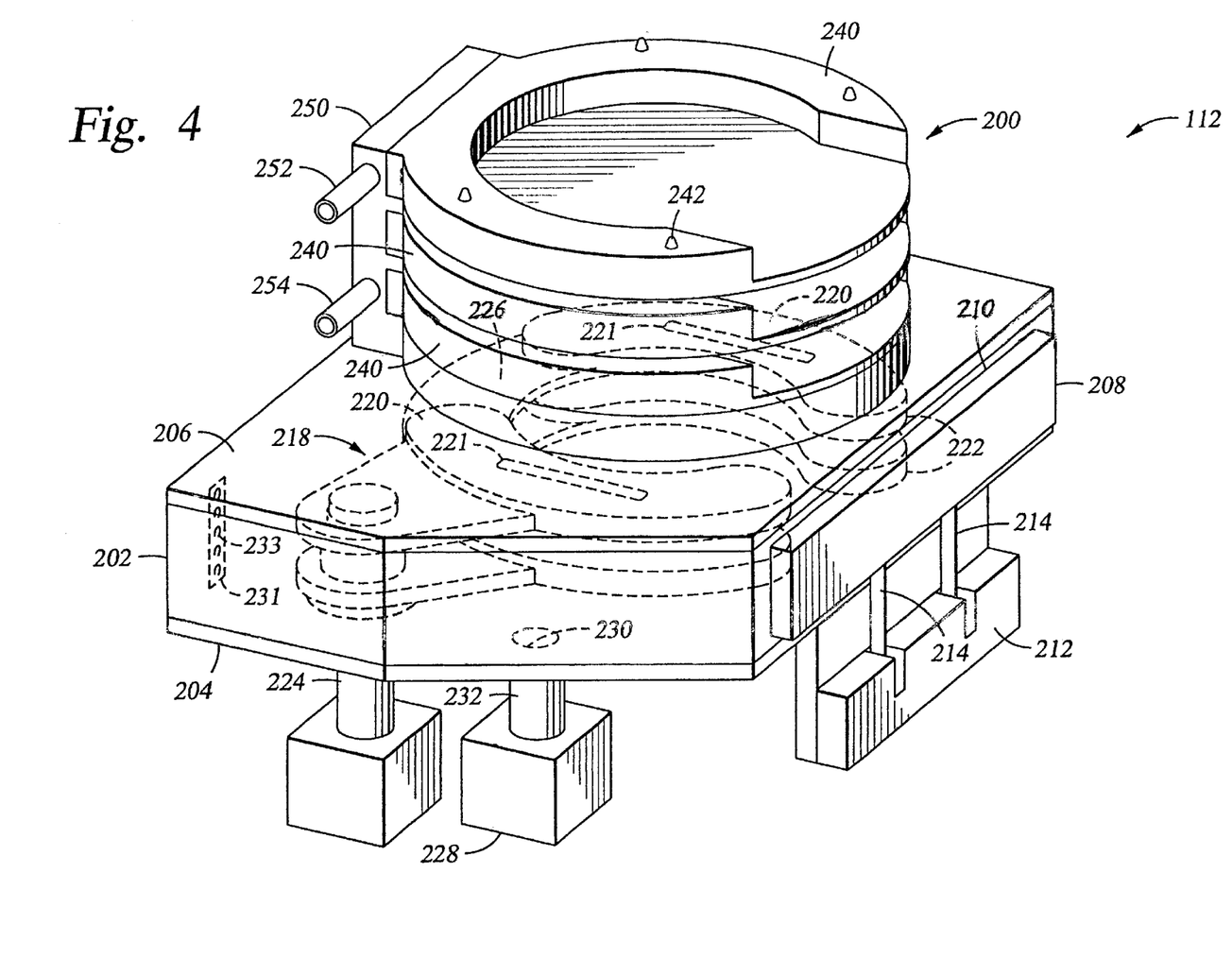
FIG. 4 is a perspective view, showing an embodiment of a load-lock chamber and staging rack in accordance with an embodiment of the present invention.

FIG. 4 is a substantially side perspective view of one embodiment of a load-lock chamber 112 of the invention. The load-lock chamber 112 includes; a sidewall 202 engaging the transfer chamber 102 on one side and the front staging area 104 on the other side, a bottom 204 positioned below the sidewall 202 and a lid 206 disposed parallel to the bottom 204 and on which the staging rack 200 is mounted. The load-lock chamber is preferably made of aluminum. An access port 105 is disposed in the sidewall 202, opposite a loading port 208, having a substrate loading door 210 mounted thereon, to allow substrates to be transferred from the load-lock chamber 112 into the transfer chamber 102. A slit valve 107 is preferably used to seal the access port 105 and loading port 208 when isolation or staged vacuum is desired. A service port and service door or window (not shown) may be disposed on one side of the load-lock chamber 112 to provide service and visual access to the load-lock chamber 112. A loading door 210 and door actuator 212 are shown in a closed and sealed position in FIG. 4. The actuator 212 is disposed below the loading door 210 and is in communication with the loading door 210 by movable shafts 214. The actuator 212 rotates laterally away from the sidewall 202 to unseal the door 210 and then the movable shafts 214 are lowered to provide clearance of the door 210 and access to the port 208. One door actuator used to advantage is available from VAT, located in Switzerland.

A load-lock cassette 218 is disposed within the load-lock chamber 112 to support a plurality of substrates in a spaced relationship in the load-lock chamber 112. The load-lock cassette 218 preferably includes two or more cassette plates 222 or other substrate supports disposed in a spaced vertical relationship to support two or more substrates in a stacked vertical arrangement. Preferably, the cassette plates 222 include substrate seats 220, which are preferably formed of a ceramic or other material suitable for semiconductor processing. The cassette plates 222 are semicircular in shape and are cantilever mounted to a shaft 224. The shaft 224 is disposed through the bottom 204 of the load-lock chamber 112 and is connected to a motor (not shown), such as a stepper motor or other elevator system. The elevator system disposed below the load-lock chamber 112 moves the shaft 224 upwardly and downwardly within the load-lock chamber 112 to locate the cassette plates 222 on a plane in alignment with a staging robot 113 used to load or unload substrates from the load-lock chamber 112.

Preferably, the cassette plates 222 are made of anodized aluminum and provide vertical substrate spacing sufficient to allow a robot blade to safely pass between the plates to deliver or retrieve a substrate. Each plate 222 is semicircular or C-shaped and having a raised outer portion forming a plurality, but preferably two substrate seats 220 for supporting a substrate. The substrate seats 220 are adapted to be contiguous to the shape of the cassette plate. The cassette plates 222 are adapted to define a central opening 226 for facilitating placement or removal of the substrate by the substrate handling robot 103 or the front end staging robot 113 in the load lock cassette 218. The substrate seats 220 are adapted to allow passage for a substrate blade of the substrate handling robot 103 or the front end staging robot 113. FIG. 4 shows an embodiment of a C-shaped cassette plate 222 with two raised substrate seats 220 defining a central opening 226. The substrate seats 220 may have a plurality of substrate supports 221 disposed thereon. The substrate supports 221 are preferably conical pins having a base area for aligning and supporting a substrate thereon. Preferably, four to six substrate supports 221 are disposed on the cassette plates 222. However, any number of substrate supports 221 may be used to form a seat 220 on which a substrate rests. The substrate seats 220 are preferably made of a material such as a ceramic, quartz, aluminum or other suitable material used in semiconductor processing. The substrates are preferably supported about 1 to about 15 mils above the cassette plates 222. Alternatively, the substrate seats 220 may comprise two elongate members 221 positioned on either side of the cassette plates 222.

An exhaust port 230 is disposed through the bottom of the load-lock chamber 112 and is connected to an on-board vacuum pump 228 via exhaust line 232. The on-board vacuum pump 228 is disposed below the load-lock chamber 112 to pump down the loadlock chamber 112 and the transfer chamber 102. The pump 228 is preferably a high vacuum turbo pump capable of providing milliTorr pressures with very low vibration. One vacuum pump used to advantage is available from BOC Edwards Vacuum Technology, Austin, Tex. However, other pumps such as roughing pumps, cryogenic pumps or the like could be used alone or in combination with one another.

Gas-bound particles are prevented from entering the transfer chamber 102 by continually exhausting gases out of the system through the load-lock chamber 112. A gas diffuser 231 is preferably disposed in the sidewall 202 of the load-lock chamber 112 to facilitate venting up to atmosphere. The gas diffuser 231 is preferably a conduit disposed in the load-lock chamber and may be connected to a gas purge line (not shown) such as a nitrogen purge gas line. The gas diffuser 231 distributes the purge gas along a larger surface area through a plurality of gas diffuser ports 233 disposed along the length of the diffuser 231, thereby decreasing the time needed to vent the load-lock chamber 112 up to atmosphere. It should be noted that the atmospheric volume within the load-lock chamber 112 is desired to be as small as practical while providing suitable volume for operation of the components contained therein, thus providing for quick and efficient pump down and venting of the load-lock chamber 112. It has been found that, by limiting the volume to permit containment of only two rows of substrates within the load load-lock chamber 112 during pump down and/or venting, the pump down and venting time can be reduced to about 8 seconds.

An external staging, or storage rack, 200 is preferably disposed on a load-lock chamber 112, and is coupled with an associated heat sink 250 in accordance with an embodiment of the invention. The staging rack 200 is shown mounted external to the transfer chamber 102 and the load-lock chamber 112, and is preferably integral with or mounted above to the load-lock chamber 112 for easy access thereto by the staging robot 113. It should be understood that the staging rack 200 may also be separate from the load-lock chamber 112 and mounted at any location within the front-end staging 104 area suitable for access by the staging robot 113. It should be further understood that the staging rack 200 may be used for storing and cooling processed substrates after processing prior to their replacement into a substrate cassette 109 and for staging of the substrates prior to their transfer into the load-lock chamber 112. Accordingly, the staging rack 200 may include substrate heating mechanisms, substrate orienting mechanisms or other mechanisms for preparing the substrates for processing prior to their placement within the load-lock chamber 112.

The staging rack 200 is preferably comprised of a plurality of heat transfer plates 240 disposed in a spaced vertical relationship. The heat transfer plates are cantilever mounted to a heat sink, or radiator 250, which preferably includes a fluid input port 252 and a fluid output port 254 for circulating a fluid, such as a coolant or heating fluid, within or in fluid communication with the heat sink 250. The heat sink 250 is in thermal communication with each of the heat transfer plates 240, which are preferably made of aluminum. Heat is conducted from the substrate to the heat transfer plate 240 and then to the heat sink 250 and absorbed by the circulating coolant. In a particular embodiment, a coolant fluid, such as water or other coolant, is circulated through the fluid input port 252, through the heat sink 250 and through the fluid output port 254. A heat exchange element is preferably disposed remote from the heat sink 250. Additional cooling or pre-cooling of the coolant fluid may take place through conventional remote cooling facilities (not shown) such as by conventional refrigeration devices prior to pumping the coolant fluid throughout the staging rack 200. Each transfer plate 240 is in thermal communication with the heat sink and in a spaced vertical arrangement with each other. Each heat transfer plate 240 is preferably adapted to have a plurality of centering pins or guide pins 242 disposed therein which can be used to assist in the placement of a substrate on the staging rack 200. Preferably, the guide pins 242 are tapered or conical in shape so that the substrate can be placed within the boundary defined by the guide pins 242 when off center but, when lowered to the surface of the staging rack 200, the substrate is positioned properly for further removal by the robot. Additionally, the staging rack 200 may also include a cooling element (not shown), such as a fan or condensing unit, to facilitate cooling processed substrates retrieved from the load-lock chamber 112 prior to returning the substrates to the substrate cassettes 109 by the staging robot 113.

By placing the staging rack 200 externally of the transfer chamber 102 or the load-lock chamber 112, processed substrates may be removed from the load-lock chamber 112 for cooling in the external staging rack 200 while additional substrates are placed in the load-lock chamber 112 for continued processing. Any number of slots may be provided within the staging rack 200, so that any number of substrates may be cooled therein until the staging robot 113 removes the processed and cooled substrates from the staging rack 200 places the substrates in the substrate cassettes 109. In this way, the cooling process is effectively removed as a time and/or efficiency restraint or production limitation in the vacuum processing steps of system 100.

Figure 5:
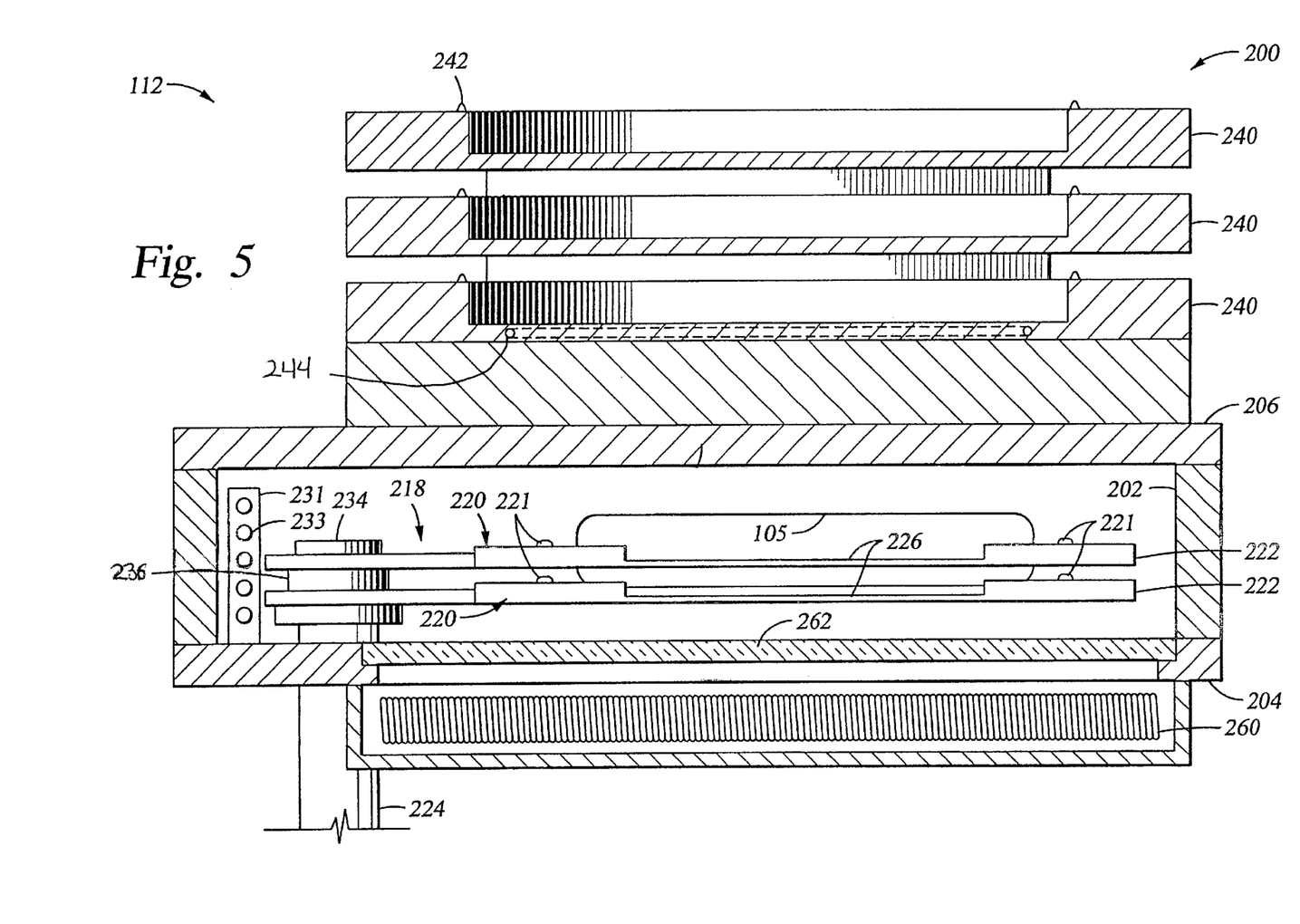
FIG. 5 is a side view of an embodiment of a load-lock chamber and associated cooling station in accordance with an embodiment of the present invention with a portion of the side wall removed.

FIG. 5 is a front view of an embodiment of a load-lock chamber 112 and associated cooling station in accordance with an embodiment of the invention with a portion of a side wall 202 removed. In the embodiment shown in FIG. 5, two rows of substrate seats 220 are provided in the load-lock chamber 112 to support two substrates in a spaced relationship. The cassette plates 222 are each supported by the moveable shaft 224, which is disposed at least partially through the bottom of the load-lock chamber. The edges of the cassette plates 222 engaging the shaft 224 are supported in a vertical spaced relationship by spacers 236, which are secured thereto with pins 234. Each plate 222 defines a central opening 226 to form a slot for the robot blade to pass under the substrate when the substrate is supported on the seat 220. It should be noted that two load-lock cassettes 218 could be provided in a single load-lock chamber 112 with either separate shafts 224 or a single integrated shaft 224 supporting the cassette plates 222. In this embodiment, two rows of substrate seats 220 are provided in each load-lock chamber 112 in two separate stacks or columns to support a total of four (4) substrates in spaced relation to allow two substrates to be transferred along side one another.

The embodiment of FIG. 5 also includes a rapid heating module, or heating element 260, which may be provided integrally with load-lock chamber 112 for pre-heating unprocessed substrates prior to their introduction into the transfer chamber 102. Preferably, the heating element 260 is disposed below the load lock chamber 112 and in communication with the load lock chamber 112 via quartz windows 262 disposed vertically below the load-lock chamber and above the heating element 260. Preferably, the heating elements 260 associated with the load-lock chamber 112 are conventional resistive heating lamps. The window is preferably made of quartz. However, any suitable material that is substantially transparent to thermal energy can be used. The heating element is preferably protected from the vacuum environment of the load-lock chamber 112 or other operating environment.

Alternatively, the heat transfer plates 240 may have a resistive heating element 244 disposed thereon or embedded therein and may be used to selectively heat substrates disposed on heat transfer plates 240. Because the heat transfer plates 240 are located in ambient environment, resistive heating can be used to pre-heat substrates prior to entry into the load-lock chamber or as a post-processing treatment if desired. It has also been found that pre-heating of substrates prior to processing can reduce substrate temperature stabilization time by as much as 75% or more, thereby greatly improving the throughput of the system. Preferably, the heating element 244 associated with heating individual substrates is a resistive type coil heating element.

It should be noted that any of the heating elements 260 or 244 may be selectively activated and de-activated depending on whether the substrate within load-lock chamber 112 has been processed and whether it is desired to cool and/or pre-heat a particular substrate. In the event that the substrate within the load-lock chamber 112 has been processed, it may not be desirable to further heat the substrate. Instead, it may be desirable to permit the substrate to cool down prior to being placed in the staging rack 200. Accordingly, the heating element would be de-activated. Alternatively, in the event that the substrate contained within the load-lock chamber 112 is waiting to be processed, the heating element 260 may be activated so that the substrate will be heated to a desirable temperature prior to processing. In addition, although not shown, a removable shield may be provided between the heating element 260 and the substrate to selectively shield the substrate from the radiant energy from the heating element 260 to limit, prevent, or otherwise control the heating of a particular substrate.

Figure 6:
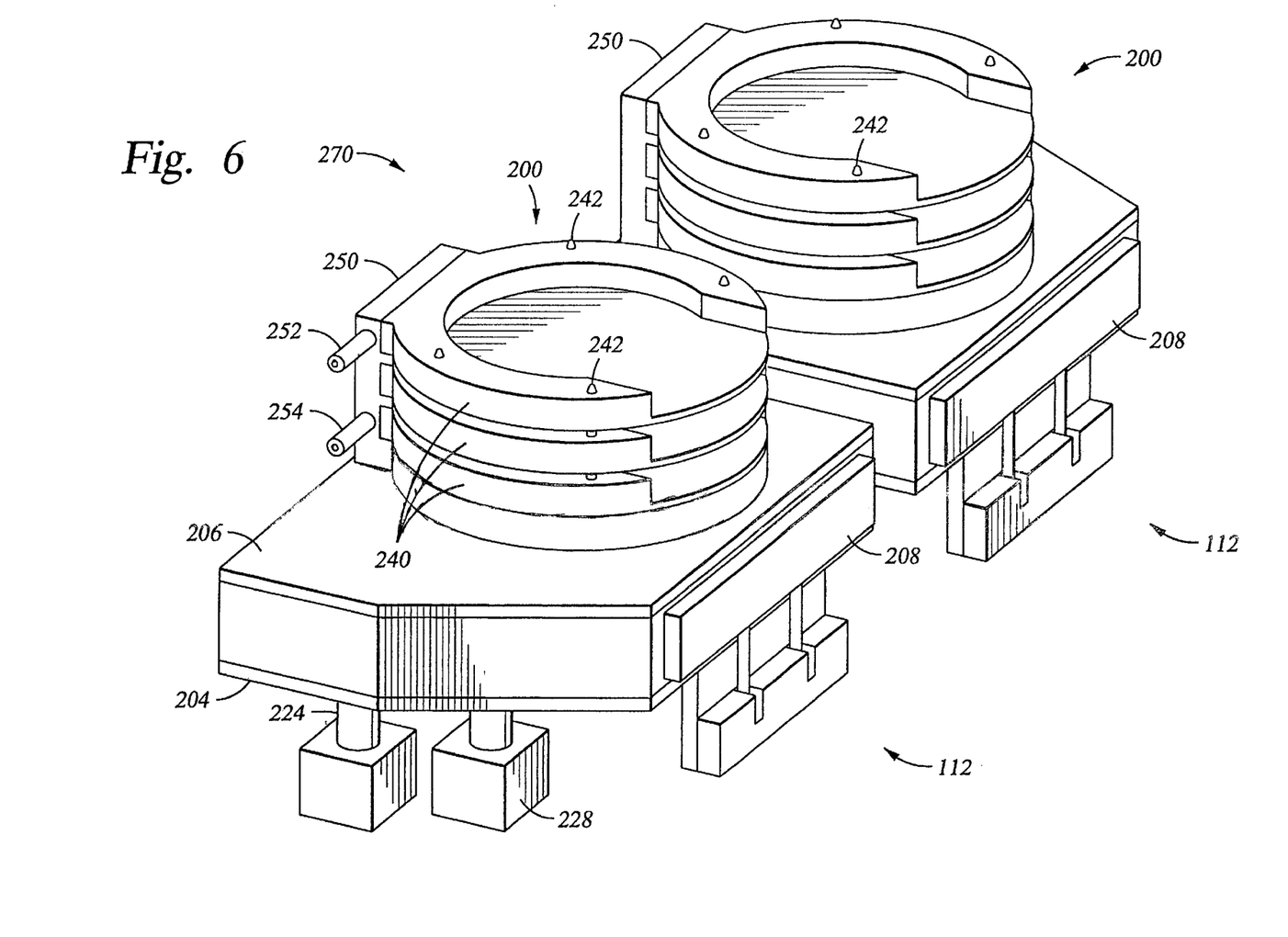
FIG. 6 is a perspective view of an alternative embodiment of dual load-lock chambers and staging racks in accordance with an embodiment of the present invention.

FIG. 6 is a substantially side perspective view of an alternative embodiment of the invention showing a pair of load-lock chambers 112 disposed in a tandem chamber configuration 270. The load-lock chambers 112 are similar to the embodiment described in reference to FIGS. 4 and 5. In the embodiment shown in FIG. 6, two rows of substrate seats 220 are provided in each load-lock chamber 112 in two separate stacks or columns to support a total of four (4) substrates in spaced relation to allow two substrates to be transferred along side one another. Each tandem load-lock chamber 112 has an external staging rack 200 mounted vertically thereon. The staging racks 200 of the tandem load-lock chambers 112 may be cooling racks providing cooling of a substrate, pre-heating racks providing pre-heating of a substrate, or a combination thereof.

Figure 6A:
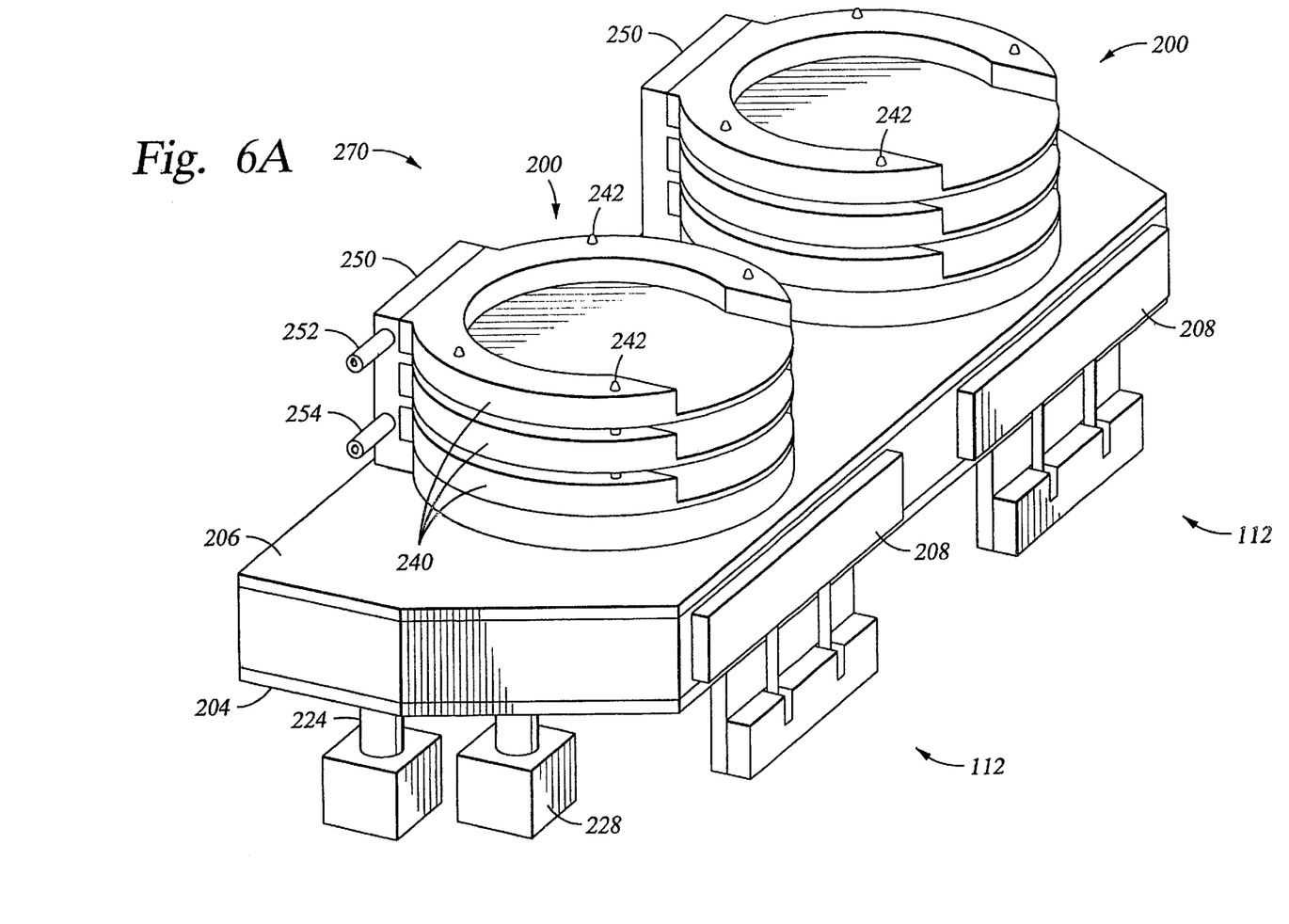
FIG. 6A is a perspective view of an alternative embodiment of a two stack loadlock chamber and staging racks in accordance with an embodiment of the present invention.

FIG. 6A is a substantially side perspective view of an alternative embodiment of the invention showing two load-lock cassettes 218 provided in a single load-lock chamber 112 with either separate shafts 224 or a single integrated shaft 224 supporting the cassette plates.

Figure 7:
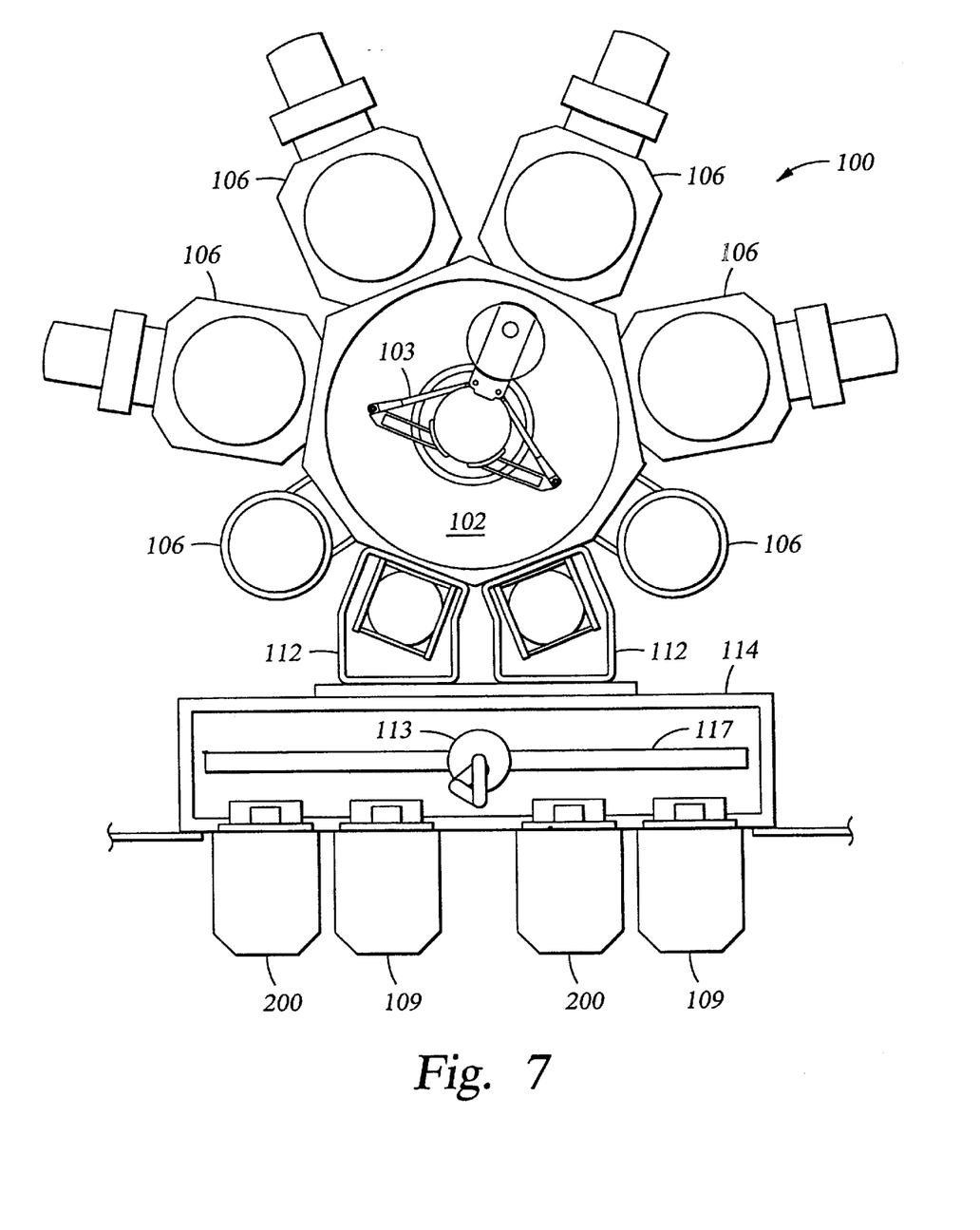
FIG. 7 is a top schematic view of a second embodiment of a vacuum system in accordance with the present invention.

FIG. 7 shows an embodiment of the invention in which a processing system 100 having a plurality of load-lock chambers 112 each having a single stack of two substrates. In this an embodiment a single load-lock chamber 112 may be provided at a plurality of facets of a transfer chamber 102, preferably two load-lock chambers 112 mounted at two facets and in communication with the front end staging area 104. A transfer chamber 102 is in communication with a plurality of substrate processing chambers 106 and housing a single blade substrate handling robot 103 wherein the substrate handling robot 103 transfers substrates to and from the substrate process chambers 106. The staging robot 113 may be mounted on a track 117 to provide lateral travel of the staging robot 113 and access to a plurality of load-lock chambers 112. In this embodiment, the staging, or storage rack 200 may be mounted to or disposed integral with load-lock chamber 112 according to the first embodiment shown in FIGS. 5 and 6 or may be connected to or otherwise associated with staging area 104. As shown in FIG. 7, separate staging racks 200 may be provided proximate each substrate cassette 109 for efficient transfer of processed and unprocessed substrates. In operation, the second embodiment operates substantially the same as that of the first embodiment, except that the staging robot 103 would retrieve a single substrate at a time from one of the one or more load-lock chambers 112.

Figure 8A:
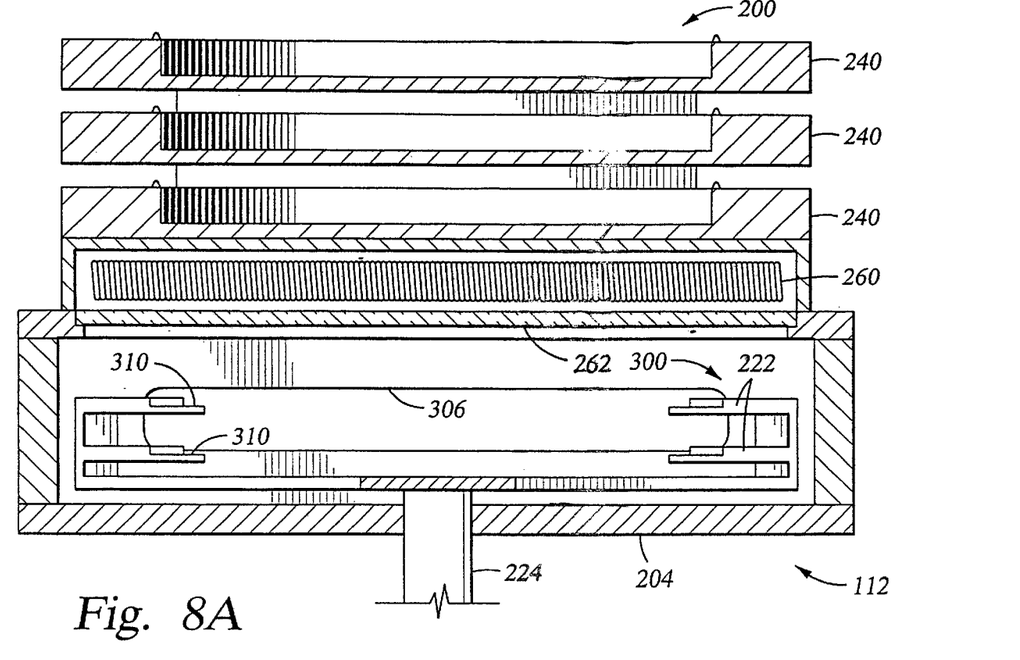
FIG. 8A is a side view of an embodiment of a single stack load-lock chamber and associated cooling station in accordance with an embodiment of the present invention with a portion of the side wall removed, and also depicting a spider-type substrate support member in accordance with the present invention.
Figure 8B:
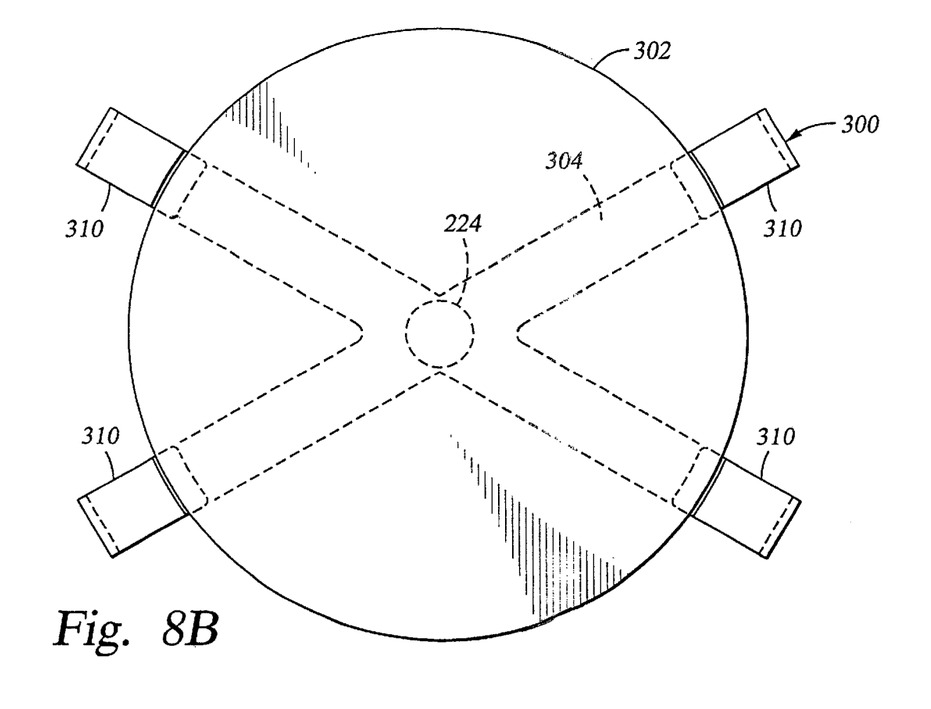
FIG. 8B is a top view of the spider-type substrate support member of FIG. 8A, showing the edge support studs arranged around the periphery of a substrate.

FIGS. 8A and 8B illustrate another embodiment of a substrate support member disposed in a load-lock chamber 112. The embodiment shown is referred to as a modified load-lock, or spider-type, assembly 300 which may be utilized to minimally support the substrates 302 within the load-lock chamber 112 near their edges rather than on the substrate supports 220 described above in reference to FIGS. 4 and 5. By minimally supporting the substrates near their edges, the modified load-lock cassette assembly 300 minimizes thermal conduction from the substrates during and after the pre-heating process while the substrates remain within the load-lock chamber 112 prior to processing. In the embodiment shown in FIGS. 8A and 8B, the spider-type assembly includes a plurality of cassette arms 304 each having a substrate support 310 connected thereto to support two substrates in a spaced vertical relationship. Four substrate supports 310 are preferably provided for each substrate 302 supported thereby. The cassette arms 304 extend radially from the central shaft 224 and are arrayed circuitously around the substrate 302. The supports 310 define a recess formed at the end of each cassette arm 304. The supports 310 define an annular central channel 306 forming a slot for the robot blade to pass under the substrate when the substrate is supported on the cassette assembly 300. The modified load-lock cassette assembly 300 is supported axially by the moveable shaft 224, which is disposed through the bottom portion of the load-lock chamber. It should be noted that two load-lock cassettes 218 could be provided in a single load-lock chamber 112. In this embodiment, two rows of cassette assemblies 300 are provided in each load-lock chamber 112 in two separate stacks or columns to support a total of four (4) substrates in spaced relation to allow two substrates to be transferred along side one another. In the spider-type assembly 300, the heating element 260 can be mounted vertically above the load-lock 112 and vertically below the storage rack 200 as shown in FIG. 8A or below as shown in FIG. 5, to provide heating to the load-lock 112.

The spider-type assembly 300 shown in FIG. 8 is a single stack load-lock chamber 112. However, it should be understood that the modified spider-type load-lock assembly 300 may also include support structures 310 for supporting two or more stacks of substrates. Similarly, it should be understood that any number of support assemblies are contemplated which could be used to support two rows of substrates in one or more stacks within the load-lock chamber of the present invention.

In operation, processed substrates are allowed to cool in the staging rack 200. Thereafter, the staging robot 113 retrieves the processed and cooled substrates from the staging rack 200 and returns the processed substrates to the substrate cassette 109. In this way, continuous processing of the vacuum processing system 100 may be provided without requiring substrate handling robot idle time while the load-lock chamber 112 pumps down to a vacuum level and/or vents up to atmosphere. It should be noted that the processed substrates may accumulate in staging, or storage rack 200 until the staging robot 113 has sufficient idle time to remove the processed and cooled substrates from therewith for placement within awaiting substrate cassettes 109.

It should be understood that, in a particular embodiment, the unprocessed substrate or set of substrates may be retrieved from within the substrate cassette by the staging robot 113 and placed within the load-lock chamber 112 prior to retrieval of the processed substrate or set of substrates from within the load-lock chamber 112 and placement of the processed substrate or set of substrates within the staging or storage rack 200 by the staging robot 113, in which the substrates may be cooled as previously described.

In addition, a substrate can be heated prior to entry into the loading lock chamber 112. Pre-heating of the substrate may occur by activating the resistive heating element 244 disposed on or in the heat transfer plates 240 prior to being transferred to a load-lock chamber 112. In such an embodiment, the staging robot 113 retrieves an unprocessed substrate from a substrate cassette 109 and positions the unprocessed substrate on an empty heat transfer plate for heating. Thereafter, the heating element 244 associated with the staging rack 200 is activated to pre-heat the substrate. Following pre-heating, the staging robot 113 retrieves the pre-heated substrate and places the pre-heated substrate in the load-lock chamber 112 for further processing.

While the foregoing is directed to preferred embodiments of the present invention, other and further embodiments of the invention may be devised without departing from the basic scope thereof. The scope of the invention is determined by the claims which follow.

What is claimed is:

1. A vacuum apparatus for processing substrates, comprising:
   (a) a transfer chamber;
   (b) one or more processing chambers connected to the transfer chamber;
   (c) a substrate handling robot disposed in the transfer chamber; and
   (d) at least one load-lock chamber connected to the transfer chamber, and having one or more substrate support members for supporting one or more stacks of two substrates; and
   (e) one or more storage racks associated with the load-lock chamber for receiving and temporarily storing substrates externally to the load-lock chamber.

2. The apparatus of claim 1, wherein the racks further comprise a substrate staging area.

3. The apparatus of claim 2, further comprising a staging robot disposed in the staging area to load substrates into and remove substrates from the load-lock chamber.

4. The apparatus of claim 3, wherein the staging robot is positioned between a first and a second substrate cassette turntable.

5. The apparatus of claim 4, wherein the substrate handling robot comprises a plurality of substrate handling blades for concurrently transporting a plurality of substrates between the load-lock chamber and the one or more processing chambers.

6. The apparatus of claim 5, wherein the plurality of substrate handling blades are coplanar.

7. The apparatus of claim 6, wherein the one or more storage racks are for receiving and temporarily storing substrates between transfer of a substrate between the load-look chamber and substrate storage cassette.

8. The apparatus of claim 7, wherein at least one of the one or more storage racks is adapted to temporarily receive and cool processed substrates retrieved from the load lock chamber following processing in the one or more processing chambers.

9. The apparatus of claim 8, wherein at least one of the one or more storage racks is adapted to temporarily receive and cool processed substrates includes a cooling element.

10. The apparatus of claim 7, wherein at least one of the one or more storage racks is adapted to temporarily receive and pre-heat unprocessed substrates retrieved from a substrate cassette for processing in the one or more processing chambers.

11. The apparatus of claim 10, wherein at least one of the one or more storage racks is adapted to temporarily receive and pre-heat unprocessed substrates includes a heating element.

12. The apparatus of claim 7, wherein the load-lock chamber includes a heating element disposed in connection therewith for pre-heating unprocessed substrates in the load-lock chamber.

13. The apparatus of claim 1, wherein each of the at least one load-lock chambers includes a single substrate support member for receiving a single stack of two substrates.

14. The apparatus of claim 1, wherein each of the at least one load-lock chambers includes a dual substrate support member for receiving two stacks of two substrates each.

15. The apparatus of claim 1, having a plurality of load-lock chambers, each load-lock chamber connected to a different facet of the transfer chamber.

16. The apparatus of claim 13, wherein the at least one load-lock chambers is a single load-lock chamber connected to a single facet of the transfer chamber.

17. A method of processing substrates, comprising:
(a) providing unprocessed substrates to a load-lock chamber with a staging robot;
(b) retrieving the unprocessed substrates from the load-lock chamber with a substrate handling robot located within a transfer chamber;
(c) processing the unprocessed substrates in one or more process chambers connected to the transfer chamber;
(d) returning the processed substrates in the load-lock chamber with the substrate handling robot;
(e) retrieving the processed substrates from the load-lock chamber with the staging robot;
(f) placing the processed substrates in a cooling station located external to the load-lock chamber and the transfer chamber;
(g) allowing the processed substrates to cool in the cooling station; and
(h) retrieving the processed and cooled substrates from the cooling station with the staging robot and placing them in substrate cassettes.

18. A method of processing substrates, comprising:
(a) providing a vacuum apparatus with a transfer chamber, one or more processing chambers connected to the transfer chamber, a substrate handling robot disposed in the transfer chamber, and a single load-lock chamber connected to the transfer chamber and having at least one substrate support member for supporting two substrate sets;
(b) initially loading the load-lock chamber and transfer chamber with unprocessed substrates;
(c) processing a substrate in one or more processing chambers;
(d) removing the processed substrate from the one or more processing chambers with a substrate handling robot;
(e) placing the processed substrate within the load-lock chamber with the substrate handling robot;
(f) retrieving the unprocessed substrate within the load-lock chamber with the substrate handling robot;
(g) retrieving the processed substrate within the load-lock chamber with a staging robot located external to the load-lock chamber;
(h) placing the processed substrate within a storage rack located external to the load-lock chamber with the staging robot; and
(i) repeating steps c through h, while retrieving cooled substrates from the storage rack with the staging robot and placing the cooled substrates within substrate cassettes with the staging robot during staging robot idle time.

19. The method of claim 18, wherein each substrate set includes a single substrate in each of two substrate stacks.

20. The method of claim 19, including the step of pre-heating the unprocessed set of substrates within the load-lock chamber prior to its removal by the substrate handling member.

21. The method of claim 19, including the step of pre-heating the unprocessed set of substrates within the storage rack prior to its placement in the load-lock chamber.

22. The method of claim 18, wherein each substrate set includes a single substrate in a single substrate stack.

23. The method of claim 22, including the step of pre-heating the unprocessed set of substrates within the load-lock chamber prior to its removal by the substrate handling member.

24. The method of claim 22, including the step of pre-heating the unprocessed set of substrates within the storage rack prior to its placement in the load-lock chamber.

25. A staging module for use with a substrate processing system, comprising:
(a) at least one load-lock chamber adapted to be connected to a transfer chamber of the substrate processing system; and
(b) one or more storage racks associated with the load-lock chamber for receiving and temporarily storing substrates.

26. The staging module of claim 25, wherein at least one of the one or more storage racks is a cooling rack adapted to cool processed substrates following processing by the substrate processing system.

27. The staging module of claim 25, wherein at least one of the one or more storage racks is a pre-heating rack adapted to pre-heat unprocessed substrates prior to processing by the substrate processing system.

28. The staging module of claim 26, wherein the cooling rack includes a cooling element.

29. The staging module of claim 27, wherein the pre-heating rack includes a pre-heating element.

30. The staging module of claim 29, wherein the pre-heating rack includes a substantially thermally transparent window between the heating element and the substrate.

31. The staging module of claim 30, wherein the substantially thermally transparent window is a quartz window.

32. A method for processing substrates, comprising:
transferring a substrate to a rack disposed in atmospheric staging area of a factory interface that is coupled to a load-lock chamber; and
thermally conditioning the substrate in the staging area.

33. The method of claim 32, wherein the step of transferring further comprises:
transferring the substrate from the load-lock chamber to the staging area.

34. The method of claim 32, wherein the step of transferring further comprises:
transferring the substrate from a substrate storage cassette to the staging area.

35. The method of claim 32, wherein the step of thermally conditioning the substrate further comprises heating the substrate; and
transferring the substrate to the load-lock chamber.

36. The method of claim 32, wherein the step of thermally conditioning the substrate further comprises cooling the substrate; and
transferring the substrate to a substrate storage cassette.

37. A vacuum apparatus for processing substrates, comprising:
(a) a housing adapted to receive one or more substrate storage cassettes;

(b) one or more substrate storage racks disposed in the housing each rack having a cooling element;

(c) a port formed in the housing and adapted be coupled to a load-lock chamber; and (d) a robot disposed in the housing and adapted to transfer substrates between the racks, substrate storage cassettes and the load-lock chamber.

38. A vacuum apparatus for processing substrates, comprising:

(a) a transfer chamber;

(b) one or more chambers connected to the transfer chamber, wherein at least one of the one or more chambers are selected from the group consisting of a processing chamber and a load lock chamber having one or more substrate support members for supporting one or more stacks of two substrates;

(c) a substrate handling robot disposed in the transfer chamber; and (d) one or more storage racks including a thermal control element, wherein the one or more storage racks are external to the transfer chamber and the one or more chambers connected to the transfer chamber.

* * * * *